US 6,642,759 B1

(12) United States Patent
Hughes

(10) Patent No.: US 6,642,759 B1
(45) Date of Patent: Nov. 4, 2003

(54) CHARGE PUMP USING SWITCHED CAPACITORS FOR PHASE-LOCKED LOOP CONTROL AND METHOD OF OPERATION

(75) Inventor: Rodney A. Hughes, Tacoma, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/234,426

(22) Filed: Sep. 4, 2002

(51) Int. Cl.[7] ................................................ H03L 7/06
(52) U.S. Cl. ........................................ 327/157; 327/148
(58) Field of Search ................................ 327/148, 157, 327/536, 306, 319; 331/17

(56) References Cited

U.S. PATENT DOCUMENTS 5,646,563 A * 7/1997 Kuo .......................... 327/157
5,670,869 A * 9/1997 Weisenbach ................ 323/313
5,912,575 A * 6/1999 Takikawa ................... 327/157

* cited by examiner

Primary Examiner—Tuan T. Lam

(57) ABSTRACT

A charge pump for injecting a charging current onto a loop filter when a pump control signal is enabled. The charge pump comprises: i) MOS output transistors for injecting or removing the charge onto the loop filter; ii) pre-charge capacitors for storing pre-charge voltages at least equal to the desired gate-to-source voltages of the output transistors; and iii) switching circuitry for coupling the pre-charge capacitors to the gates of the output transistors when the Pump Up and/or Pump Down signals are enabled. The appropriate pre-charge voltage turns on the appropriate output transistor and the charging and/or discharging current is adjusted to a final level determined by the desired gate-to-source voltages and monitoring circuits.

23 Claims, 2 Drawing Sheets

CHARGE PUMP USING SWITCHED CAPACITORS FOR PHASE-LOCKED LOOP CONTROL AND METHOD OF OPERATION

TECHNICAL FIELD OF THE INVENTION

The present invention is generally directed to charge pumps for use in phase-locked loops (PLLs) and delay locked loops (DLLs), and more specifically, to an integrated circuit that uses switched capacitors to switch on the transistors in a charge pump.

BACKGROUND OF THE INVENTION

In recent years, there have been great advancements in the speed, power, and complexity of integrated circuits (ICs), such as application specific integrated circuit (ASIC) chips, Radio Frequency Integrated Circuits (RFIC), central processing unit (CPU) chips, digital signal processor (DSP) chips and the like. These advancements have made possible the development of system-on-a-chip (SOC) devices, among other things. A SOC device integrates into a single chip all (or nearly all) of the components of a complex electronic system, such as a wireless receiver, cell phone, television receiver, microprocessor, high-speed data transceiver, or the like.

In many integrated circuits, the clock signals that drive an integrated circuit are generated by a frequency synthesizer phase-locked loop (PLL) or a delay locked loop (DLL). PLLs and DLLs are well known to those skilled in the art and have been extensively written about. The dynamic performance of the frequency synthesizer that is used to generated clock signals is dependent on several parameters, including the natural frequency ($F_n$), the damping factor ($D_F$), the crossover frequency ($F_o$) and the ratio of the comparison frequency ($F_c$) to the crossover frequency. The first three parameters depend on the voltage controlled oscillator (VCO) gain ($K_o$), the F/B (N) divider value, the charge pump current ($I_c$), and the loop filter components. The last parameter (i.e., the ratio of comparison frequency to crossover frequency) is dependent on the input divider (M) value, as well as the frequency of the input clock itself.

The performance of the frequency synthesizer also depends on the performance of the charge pump located in the PLL or DLL. The charge pump pulse timing jitter and pulse amplitude noise both contribute to synthesizer phase noise. A typical charge pump includes circuitry to avoid what is known as the "dead zone," which occurs at or near the PLL "lock" state when the phase error is very small and the loop gain would otherwise approach zero. To avoid this problem, both the Pump Up current source and the Pump Down current source of a charge pump are turned on simultaneously for a brief period at the end of each phase detector cycle. However, to reduce charge pump output noise, it is desirable to reduce the ON time of the charge pump outputs in the lock state.

However, reducing the ON time of the charge pump is problematic due to the gate capacitances of the output transistors of the charge pump. Each output transistor is a relatively large device having a proportionately large gate-to-source capacitance (Cgs). Charging and discharging the gate-to-source capacitance (or gate capacitance) increases the delay time for turning the output transistors ON and OFF.

Therefore, there is a need in the art for improved frequency synthesizers for use in generating reference frequency signals. In particular, there is a need in the art for improved charge pumps for use in phase-locked loops or delay-locked loops. More particularly, there is a need for charge pumps that can be turned on and turned off very rapidly.

SUMMARY OF THE INVENTION

The present invention provides a charge pump implemented with a pair of CMOS transistors. A P-channel output transistor forms the charging current source and an N-channel output transistor forms the discharging (sinking) current source. Each of the output transistors is turned on by a pre-charged capacitor that is selectively connected to the gate of each output transistor by switch. The pre-charged capacitors are pre-charged to an appropriate over-voltage level by a very low-noise voltage reference circuit. When the switch is turned on, the pre-charged capacitor is suddenly connected to the gate capacitance of the output transistor. The charge on the pre-charge capacitor then flows onto the gate capacitance. The over-voltage on the pre-charge capacitor ensures that the parallel combination of the pre-charged capacitor and the output transistor gate capacitance settles to the proper final Vgs value that cause the proper final drain current. When the switch is turned off, the switch connects the gates of the output transistors to ground, thereby discharging the gate capacitance.

The pre-charged capacitors greatly decrease the delay time for turning on the output transistors. Grounding the gates through the switch decreases the delay time for turning off the output transistors. Thus, the switched capacitor configuration results in much faster output transistor switching times. The faster switching times minimize the amount of time the output transistors are turned on during the lock state, thereby minimizing the contribution of the charge pump to the total output noise of the PLL during the lock state.

Also, the switched capacitor configuration decouples the speed (or bandwidth) requirements of the voltage reference circuits used to pre-charge the pre-charged capacitors from the pump output switching requirements. This allows low-noise circuitry and filtering techniques to be applied to the voltage reference circuits. Also, a digital-to-analog converter (DAC) coupled with appropriate control logic may be used to generate the pre-charge reference voltage. This permits the use of fast PLL lock techniques that modulate loop gain and filter parameters when changing frequencies.

To address the above-discussed deficiencies of the prior art, it is a primary object of the present invention to provide an improved charge pump capable of injecting a charging current onto a loop filter coupled to an output of the charge pump when a Pump Up control signal received by the charge pump is enabled. According to an advantageous embodiment of the present invention, the charge pump comprises: i) a P-channel output transistor capable of injecting the charging current onto the loop filter; ii) a first pre-charge capacitor capable of storing a first pre-charge voltage at least equal to a first desired gate-to-source voltage of the P-channel output transistor; and iii) first switching circuitry capable of coupling the first pre-charge capacitor to a gate of the P-channel output transistor when the Pump Up signal is enabled, such that the first pre-charge voltage turns on the P-channel output transistor and the charging current is adjusted to a final level determined by the first desired gate-to-source voltage.

According to one embodiment of the present invention, the first switching circuitry is capable of discharging the first desired gate-to-source voltage of the P-channel output transistor when the Pump Up control signal is disabled.

According to another embodiment of the present invention, the first switching circuitry discharges the first desired gate-to-source voltage by coupling the gate of the P-channel output transistor to a VDD power supply rail.

According to still another embodiment of the present invention, the charge pump further comprises: iv) a first low noise voltage reference having a first reference voltage output coupled to the first pre-charge capacitor, wherein the first reference voltage output is capable of charging the first pre-charge capacitor to the first pre-charge voltage; and v) a charge pump output control circuit coupled to the first low noise reference and capable of adjusting the first reference voltage output to thereby control the final level of the charging current.

According to yet another embodiment of the present invention, the charge pump further comprises: vi) a P-channel mirror transistor matched to the P-channel output transistor and having a gate coupled to the gate of the P-channel output transistor such that the P-channel mirror transistor and the P-channel output transistor have identical gate to-source voltages and a mirror current of the P-channel mirror transistor mirrors the charging current in the P-channel output transistor by a factor M; and vii) a charging current monitor capable of monitoring the mirror current of the P-channel mirror transistor.

According to a further embodiment of the present invention, the charge pump is capable of sinking a discharging current from the loop filter when a Pump Down control signal received by the charge pump is enabled, the charge pump further comprising: viii) an N-channel output transistor capable of sinking the discharging current from the loop filter; ix) a second pre-charge capacitor capable of storing a second pre-charge voltage at least equal to a second desired gate-to-source voltage of the N-channel output transistor; and x) second switching circuitry capable of coupling the second pre-charge capacitor to a gate of the N-channel output transistor when the Pump Down signal is enabled, such that the second pre-charge voltage turns on the N-channel output transistor and the discharging current is adjusted to a final level determined by the second desired gate-to-source voltage.

According to a still further embodiment of the present invention, the second switching circuitry is capable of discharging the second desired gate-to-source voltage of the N-channel output transistor when the Pump Down control signal is disabled.

According to a yet further embodiment of the present invention, the second switching circuitry discharges the second desired gate-to-source voltage by coupling the gate of the N-channel output transistor to ground.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same.

It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
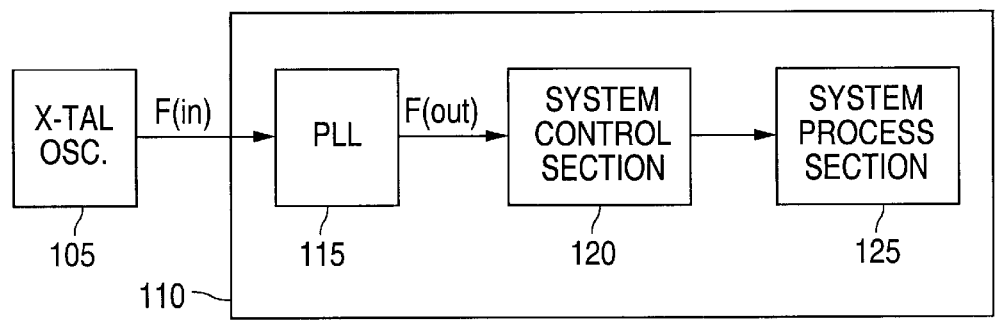
FIG. 1 illustrates an exemplary system-on-a-chip (SOC) device containing a phase-locked-loop (PLL) frequency synthesizer according to one embodiment of the present invention.
Figure 3:
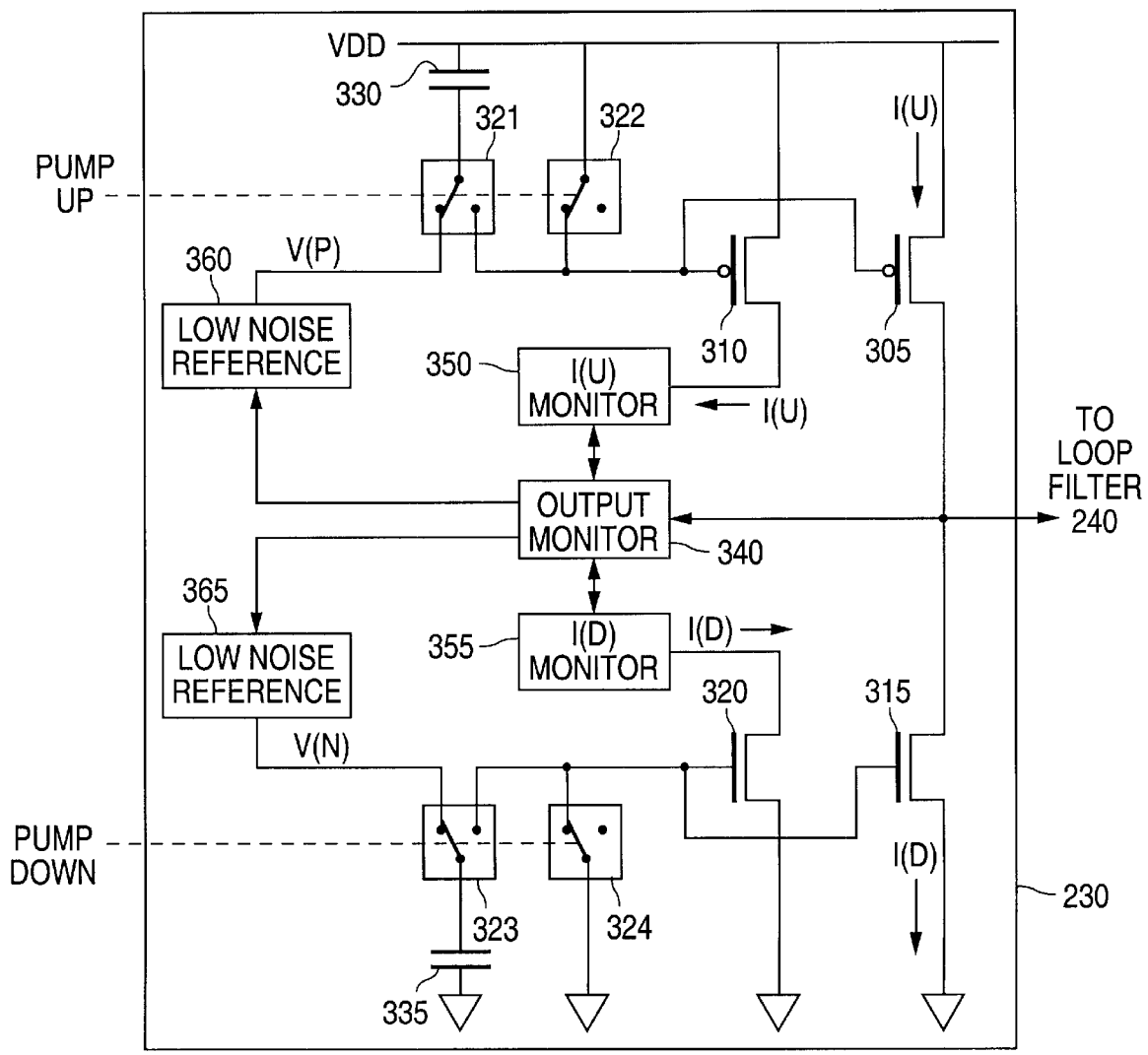
FIG. 3 illustrates selected portions of the charge current generating circuitry in the exemplary charge pump according to one embodiment of the present invention.
Figure 2:
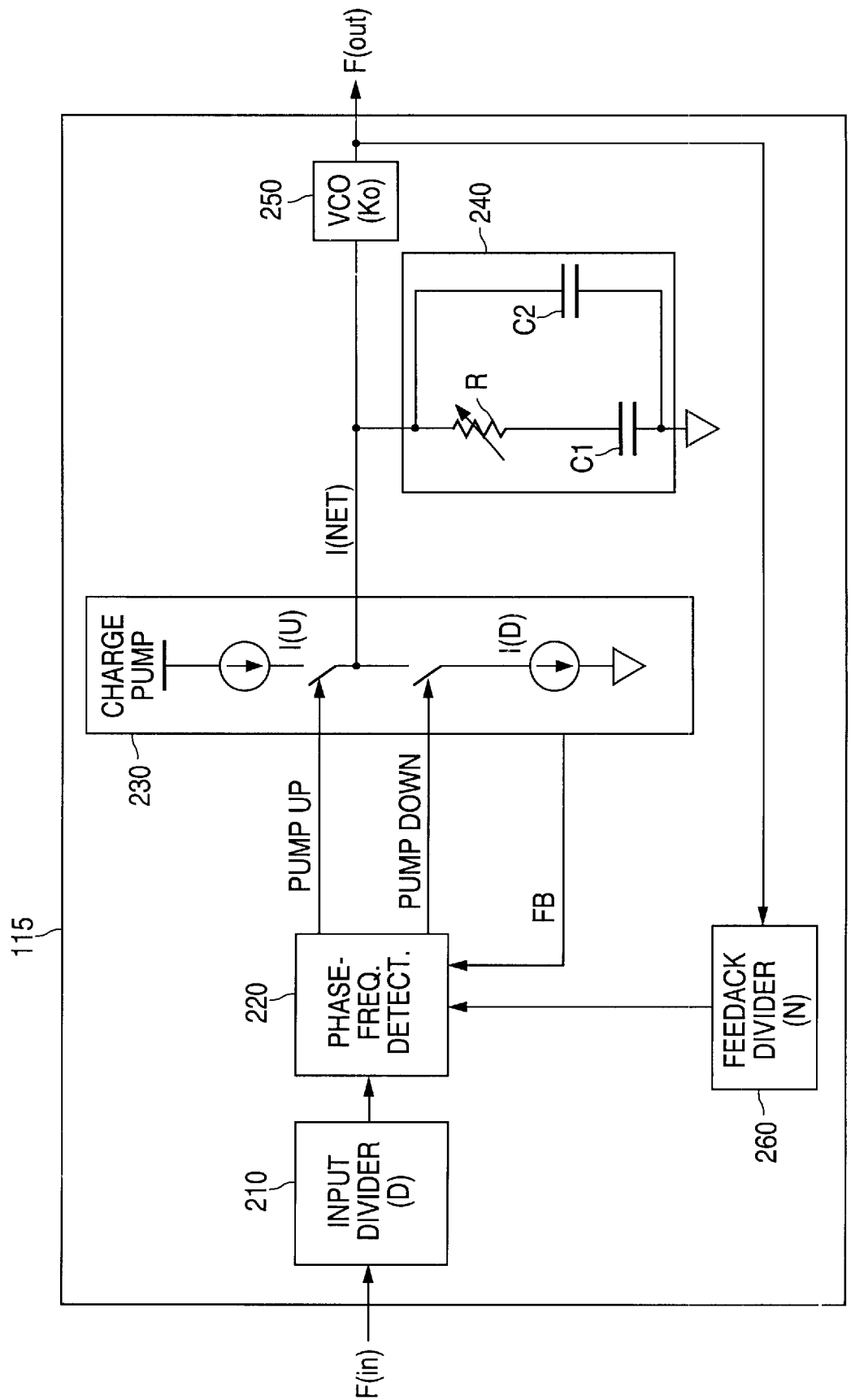
FIG. 2 illustrates the exemplary phase-locked loop frequency synthesizer in FIG. 1 in greater detail according to one embodiment of the present invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged phase locked loop or delay locked loop.

FIG. 1 illustrates exemplary system-on-a-chip (SOC) device 110 containing phase-locked-loop (PLL) 115 according to one embodiment of the present invention. SOC device 110 comprises phase-locked loop (PLL) frequency synthesizer 115, system control section 120, and system process section 125, which is capable of operating at a number of clock speeds and power supply voltages. PLL frequency synthesizer 115 receives an incoming reference frequency signal, F(in), from an external crystal (X-TAL) oscillator 105. PLL frequency synthesizer 115 generates from the F(in) signal an output clock frequency signal, F(out), which is applied to system control section 120. The F(out) clock signal can have a wide range of frequencies, depending on the task being performed by system process section 125.

FIG. 2 depicts exemplary phase-locked loop (PLL) frequency synthesizer 115 in FIG. 1 in greater detail according to one embodiment of the present invention. PLL frequency synthesizer 115 comprises input divider circuit 210, phase-frequency detector 220, charge pump 230, loop filter 240, voltage controlled oscillator (VCO) 250, and feedback divider circuit 260. Input divider circuit 210 divides the frequency of the F(in) reference clock frequency received from crystal oscillator 105 by the value D. The divided-by-D output clock signal from input divider circuit 210 forms one input to phase-frequency detector 220. The other input to phase-frequency detector 220 is the output of feedback divider circuit 260, which divides the frequency of the PLL output clock signal, F(out), by the value N.

Phase-frequency detector 220 compares the phase and frequency of the divided-by-D output clock signal from input divider circuit 210 and the divided-by-N output clock signal from feedback divider circuit 260 and generates either a Pump Up signal or a Pump Down signal, depending on whether the divided-by-N output clock signal from feedback divider circuit 260 is faster than or slower than the divided-by-D output clock signal from input divider circuit 210. If the divided-by-N output clock signal is too slow, phase-frequency detector 220 generates a Pump Up signal, which closes the top switch in charge pump 230 and injects the charge current I(U) onto capacitor C1 (through variable resistor R) and capacitor C2 in loop filter 240. If only the Pump Up signal is enabled, the current I(NET) onto loop filter 240 is equal to the charge current I(U). If the divided-by-N output clock signal is too fast, phase-frequency detector 220 generates a Pump Down signal, which closes the bottom switch in charge pump 230 and drains the charge current I(D) from capacitors C1 and C2 in loop filter 240. If only the Pump Down signal is enabled, the current I(NET) onto loop filter 240 is equal to the charge (or sink) current I(D).

The voltage on C2 is the input control voltage for VCO 250. As the voltage on C2 increases, the frequency of the output signal F(out) of VCO 250 also increases, thereby speeding up the divided-by-N output clock signal from feedback divider 260. As the voltage on C2 decreases, the frequency of the output signal F(out) of VCO 250 also decreases, thereby slowing down the divided-by-N output clock signal from feedback divider 260.

By way of example, the input signal, F(in), may be equal to 10 MHz, and the input divider value D may be 4. Thus, one input to phase-frequency detector 220 receives a 2.5 MHz signal from input divider 210. Also, the output signal, F(out), may be equal to 50 MHz and the feedback divider value N may be 20. Thus, the other input to phase-frequency detector 220 receives a 2.5 MHz signal from feedback divider 260.

A charge pump PLL, such as the one in FIG. 2, is a negative feedback system that ensures that the phase as well as the frequency at the input of phase-frequency detector 220 is (near) zero under steady state conditions. A PLL in such a state is said to be in the "lock state." As noted above, to avoid what is known as the "dead zone problem", both the Pump Up current source and the Pump Down current source of charge pump 230 are turned ON simultaneously for a brief period at the end of each cycle of phase-frequency detector 220. When the Pump Up and Pump Down signals are both ON (enabled), a feedback signal, FB, is generated by charge pump 230. The FB signal disables the Pump Up and Pump Down signals from phase-frequency detector 220.

In order to reduce charge pump output noise, it is important to minimize the simultaneous ON times of the Pump Up and Pump Down signals in the lock state. Ensuring that the output transistor devices in charge pump 230 turn ON and turn OFF as fast as possible minimizes the simultaneous ON times. The present invention provides a control circuit containing pre-charge capacitors and switches that minimize the switching times of the output transistors in charge pump 230.

FIG. 3 illustrates selected portions of the charge current generating circuitry in charge pump 230 in exemplary phase-locked loop 115 according to an exemplary embodiment of the present invention. Charge pump 230 comprises P-channel output transistor 305, P-channel mirror transistor 310, N-channel output transistor 315, N-channel mirror transistor 320, switches 321–324, pre-charge capacitor 330, and pre-charge capacitor 335. Charge pump 230 further comprises output monitor 340, charging current (I(U)) monitor 350, discharging current (I(D)) monitor 355, low noise reference 360 and low noise reference 365.

Output transistor 305 is the charging (or Pump Up) current source that injects a charging (or Pump Up) current, I(U), onto loop filter 240. When the Pump Up signal is disabled (e.g., Logic 0), the gates of output transistor 305 and mirror transistor 310 are connected to the VDD supply rail by switch 322. This turns off output transistor 305 and mirror transistor 310, because their effective gate-to-source voltages are zero volts (0 V). Also, when the Pump Up signal is disabled, one side of pre-charge capacitor 330 is coupled to the V(P) reference voltage at the output of low noise reference 360 by switch 321.

The V(P) reference voltage is set to be (ygs+$\Delta$V) volts below the VDD level of the VDD power supply rail, where Vgs is the final gate-to-source voltage of output transistor 305 and mirror transistor 310. When the Pump Up signal is disabled, the high side of pre-charge capacitor 330 is fixed at VDD volts and the low side of pre-charge capacitor 330 is pre-charged to VDD−Vgs−$\Delta$V volts. Thus, the voltage drop across capacitor 330 is Vgs+$\Delta$V volts. The magnitude of Vgs+$\Delta$V is slightly larger than the magnitude of the final gate-to-source voltages (Vgs) for output transistor 305 and mirror transistor 310 by an over-voltage amount, $\Delta$V.

When the Pump Up signal is enabled (i.e., Logic 1), switch 321 and switch 322 are switched so that the gates of output transistor 305 and mirror transistor 310 are coupled to pre-charge capacitor 330 rather than to the VDD supply rail. The pre-charge built up on pre-charge capacitor 330 suddenly flows onto the gate capacitances of output transistor 305 and mirror transistor 310. This re-distribution of charge from pre-charge capacitor 330 onto the gates of output transistor 305 and mirror transistor 310 discharges (reduces) the magnitude of the voltage, Vgs+$\Delta$V, across pre-charge capacitor 330, by the over-voltage amount, $\Delta$V. V(P) is selected such that the low side of pre-charge capacitor 330 and the gates of output transistor 305 and mirror transistor 310 settle at a final voltage that is Vgs below the VDD supply rail. If pre-charge capacitor 330 is sized to be much larger that output transistor 305 and mirror transistor 310, $\Delta$V is very small.

When the Pump Up signal is again disabled, switch 321 and switch 322 are switched so that the gates of output transistor 305 and mirror transistor 310 are discharged into the VDD supply rail and capacitor 330 is again charged to V(P)=VDD−Vgs−$\Delta$V volts.

Output transistor 315 is the discharging (or Pump Down) current source that sinks a discharging (or Pump Down) current, I(D), from loop filter 240. When the Pump Down signal is disabled (e.g., Logic 0), the gates of output transistor 315 and mirror transistor 320 are connected to ground by switch 324. This turns off output transistor 315 and mirror transistor 320, because their effective gate-to-source voltages are zero volts (0 V). Also, when the Pump Down signal is disabled, one side of pre-charge capacitor 335 is coupled to the V(N) reference voltage at the output of low noise reference 365 by switch 323.

The V(N) reference voltage is set to be (Vgs+$\Delta$V) volts above ground, where Vgs is the final gate-to-source voltage of output transistor 315. When the Pump Down signal is disabled, the low side of pre-charge capacitor 335 is fixed at ground (0 volts) and the high side of pre-charge capacitor 335 is pre-charged to Vgs+$\Delta$V volts. Thus, the voltage drop across capacitor 335 is Vgs+$\Delta$V volts. The magnitude of Vgs+$\Delta$V is slightly larger than the magnitude of the final gate-to-source voltages (Vgs) for output transistor 315 and mirror transistor 320 by an over-voltage amount, ΔV.

When the Pump Down signal is enabled (i.e., Logic 1), switch 323 and switch 324 are switched so that the gates of output transistor 315 and mirror transistor 320 are coupled to pre-charge capacitor 335 rather than to ground. The pre-charge built up on pre-charge capacitor 335 suddenly flows onto the gate capacitances of output transistor 315 and mirror transistor 320. This re-distribution of charge from pre-charge capacitor 335 onto the gates of output transistor 315 and mirror transistor 320 discharges (reduces) the magnitude of the voltage, Vgs+ΔV, across pre-charge capacitor 335, by the over-voltage amount, ΔV. V(N) is selected such that the high side of pre-charge capacitor 335 and the gates of output transistor 315 and mirror transistor 320 settle at a final voltage that is Vgs above ground. If pre-charge capacitor 335 is sized to be much larger that output transistor 315 and mirror transistor 320, ΔV is very small.

When the Pump Down signal is again disabled, switch 323 and switch 323 are switched so that the gates of output transistor 315 and mirror transistor 320 are discharged into ground and capacitor 335 is again charged to V(N)=Vgs+ΔV volts.

According to an exemplary embodiment of the present invention, P-channel output transistor 305 and P-channel mirror transistor 310 are matched devices. Since the gates of P-channel output transistor 305 and P-channel mirror transistor 310 are connected together and the sources of both devices are also connected together, P-channel output transistor 305 and P-channel mirror transistor 310 always have the same Vgs. Since Vgs is the same for both matched devices, P-channel output transistor 305 and P-channel mirror transistor 310 always have the same drain currents, I(U). Similarly, N-channel output transistor 315 and N-channel mirror transistor 320 are matched devices that always have the same Vgs and the same drain currents, I(D).

According to an alternate embodiment of the present invention, the sizes of P-channel output transistor 305 and P-channel mirror transistor 310 may be scaled by a factor M, such that P-channel output transistor 305 is M times larger that P-channel mirror transistor 310. Thus, if the drain current of P-channel output transistor 305 is I(U), then the drain current of P-channel mirror transistor 310 is I(U)/M for the same Vgs. Similarly, in an alternate embodiment of the present invention, N-channel output transistor 315 and N-channel mirror transistor 320 may be scaled by a factor M such that, if the drain current of N-channel output transistor 315 is I(D), then the drain current of N-channel mirror transistor 320 is I(D)/M for the same Vgs.

Output monitor 340 monitors the voltage on loop filter 240 at the output of charge pump 230. Output monitor 340 independently adjusts the charging current, I(U), and the discharging current, I(D). The charging current is adjusted via charging current monitor 350 and low noise reference 360. The discharging current is adjusted via discharging current monitor 355 and low noise reference 365.

Charging current monitor 350 monitors the level of mirror current (I(U) or I(U)/M)) in mirror transistor 310 and reports the measured values to output monitor 340. Since output monitor 340 knows the level of mirror current in mirror transistor 310, output monitor 340 knows or can determine the charging current, I(U), in the drain of output transistor 305. If the charging current, I(U), is too small, output monitor 340 can decrease the level of V(P) via low noise reference 360, which increases the magnitude of Vgs on output transistor 305 and increases the charging current, I(U). If the charging current, I(U), is too large, output monitor 340 can increase the level of V(P) via the low noise reference 360, which decreases the magnitude of Vgs on output transistor 305 and decreases the charging current, I(U).

Discharging current monitor 355 monitors the level of mirror current (I(D) or I(D)/M)) in mirror transistor 320 and reports the measured values to output monitor 340. Since output monitor 340 knows the level of mirror current in mirror transistor 320, output monitor 340 knows or can determine the discharging current, I(D), in the drain of output transistor 315. If the discharging current, I(D), is too small, output monitor 340 can increase the level of V(N) via low noise reference 365, which increases the magnitude of Vgs on output transistor 315 and increases the discharging current, I(D). If the discharging current, I(D), is too large, output monitor 340 can decrease the level of V(N) via low noise reference 365, which decreases the magnitude of Vgs on output transistor 315 and decreases the discharging current, I(D).

Although the present invention has been described with several embodiments, various changes and modifications may be suggested to one skilled in the art. It is intended that the present invention encompass such changes and modifications as fall within the scope of the appended claims.

What is claimed is:

1. A charge pump for injecting a charging current onto a loop filter coupled to an output of said charge pump when a Pump Up control signal received by said charge pump is enabled, said charge pump comprising:

a P-channel output transistor for injecting said charging current onto said loop filter;

a first pre-charge capacitor for storing a first pre-charge voltage at least equal to a first desired gate-to-source voltage of said P-channel output transistor; and first switching circuitry for coupling said first pre-charge capacitor to a gate of said P-channel output transistor when said Pump Up signal is enabled, such that said first pre-charge voltage turns on said P-channel output transistor and said charging current is adjusted to a final level determined by said first desired gate-to-source voltage.

2. The charge pump as set forth in claim 1 wherein said first switching circuitry is discharging said first desired gate-to-source voltage of said P-channel output transistor when said Pump Up control signal is disabled.

3. The charge pump as set forth in claim 2 wherein said first switching circuitry discharges said first desired gate-to-source voltage by coupling said gate of said P-channel output transistor to a VDD power supply rail.

4. The charge pump as set forth in claim 3 further comprising:

a first low noise voltage reference having a first reference voltage output coupled to said first pre-charge capacitor, wherein said first reference voltage output is charging said first pre-charge capacitor to said first pre-charge voltage; and a charge pump output control circuit coupled to said first low noise reference and adjusting said first reference voltage output to thereby control said final level of said charging current.

5. The charge pump as set forth in claim 4 further comprising:

a P-channel mirror transistor matched to said P-channel output transistor and having a gate coupled to said gate of said P-channel output transistor such that said P-channel mirror transistor and said P-channel output transistor have identical gate to-source voltages and a mirror current of said P-channel mirror transistor mirrors said charging current in said P-channel output transistor by a factor M; and a charging current monitor for monitoring said mirror current of said P-channel mirror transistor.

6. The charge pump as set forth in claim 5 wherein said charge pump is sinking a discharging current from said loop filter when a Pump Down control signal received by said charge pump is enabled, said charge pump further comprising:

an N-channel output transistor for sinking said discharging current from said loop filter;

a second pre-charge capacitor for storing a second pre-charge voltage at least equal to a second desired gate-to-source voltage of said N-channel output transistor; and second switching circuitry for coupling said second pre-charge capacitor to a gate of said N-channel output transistor when said Pump Down signal is enabled, such that said second pre-charge voltage turns on said N-channel output transistor and said discharging current is adjusted to a final level determined by said second desired gate-to-source voltage.

7. The charge pump as set forth in claim 6 wherein said second switching circuitry is discharging said second desired gate-to-source voltage of said N-channel output transistor when said Pump Down control signal is disabled.

8. The charge pump as set forth in claim 7 wherein said second switching circuitry discharges said second desired gate-to-source voltage by coupling said gate of said N-channel output transistor to ground.

9. The charge pump as set forth in claim 8 further comprising:

a second low noise voltage reference having a second reference voltage output coupled to said second pre-charge capacitor, wherein said second reference voltage output is charging said second pre-charge capacitor to said second pre-charge voltage, and wherein said charge pump output control circuit is coupled to said second low noise reference and is adjusting said second reference voltage output to thereby control said final level of said discharging current.

10. The charge pump as set forth in claim 9 further comprising:

an N-channel mirror transistor matched to said N-channel output transistor and having a gate coupled to said gate of said N-channel output transistor such that said N-channel mirror transistor and said N-channel output transistor have identical gate to-source voltages and a mirror current of said N-channel mirror transistor mirrors said discharging current in said N-channel output transistor by a factor M; and a discharging current monitor for monitoring said mirror current of said N-channel mirror transistor.

11. An integrated circuit comprising:

a system control section operating at a plurality of clock speeds;

at least one of a phase-locked loop (PLL) and a delay-locked loop (DLL) providing at least one clock signal to said system control section, said at least one of a PLL and a DLL comprising a charge pump for injecting a charging current onto a loop filter coupled to an output of said charge pump when a Pump Up control signal received by said charge pump is enabled, said charge pump comprising:

a P-channel output transistor for injecting said charging current onto said loop filter;

a first pre-charge capacitor for storing a first pre-charge voltage at least equal to a first desired gate-to-source voltage of said P-channel output transistor; and first switching circuitry for coupling said first pre-charge capacitor to a gate of said P-channel output transistor when said Pump Up signal is enabled, such that said first pre-charge voltage turns on said P-channel output transistor and said charging current is adjusted to a final level determined by said first desired gate-to-source voltage.

12. The integrated circuit as set forth in claim 11 wherein said first switching circuitry is discharging said first desired gate-to-source voltage of said P-channel output transistor when said Pump Up control signal is disabled.

13. The integrated circuit as set forth in claim 12 wherein said first switching circuitry discharges said first desired gate-to-source voltage by coupling said gate of said P-channel output transistor to a VDD power supply rail.

14. The integrated circuit as set forth in claim 13 further comprising:

a first low noise voltage reference having a first reference voltage output coupled to said first pre-charge capacitor, wherein said first reference voltage output is charging said first pre-charge capacitor to said first pre-charge voltage; and a charge pump output control circuit coupled to said first low noise reference and for adjusting said first reference voltage output to thereby control said final level of said charging current.

15. The integrated circuit as set forth in claim 14 further comprising:

a P-channel mirror transistor matched to said P-channel output transistor and having a gate coupled to said gate of said P-channel output transistor such that said P-channel mirror transistor and said P-channel output transistor have identical gate to-source voltages and a mirror current of said P-channel mirror transistor mirrors said charging current in said P-channel output transistor by a factor M; and a charging current monitor for monitoring said mirror current of said P-channel mirror transistor.

16. The integrated circuit as set forth in claim 15 wherein said charge pump is sinking a discharging current from said loop filter when a Pump Down control signal received by said charge pump is enabled, said charge pump further comprising:

an N-channel output transistor for sinking said discharging current from said loop filter;

a second pre-charge capacitor for storing a second pre-charge voltage at least equal to a second desired gate-to-source voltage of said N-channel output transistor; and second switching circuitry for coupling said second pre-charge capacitor to a gate of said N-channel output transistor when said Pump Down signal is enabled, such that said second pre-charge voltage turns on said N-channel output transistor and said discharging current is adjusted to a final level determined by said second desired gate-to-source voltage.

17. The integrated circuit as set forth in claim 16 wherein said second switching circuitry is discharging said second desired gate-to-source voltage of said N-channel output transistor when said Pump Down control signal is disabled.

18. The integrated circuit as set forth in claim 17 wherein said second switching circuitry discharges said second desired gate-to-source voltage by coupling said gate of said N-channel output transistor to ground.

19. The integrated circuit as set forth in claim 18 further comprising:

a second low noise voltage reference having a second reference voltage output coupled to said second pre-charge capacitor, wherein said second reference voltage output is charging said second pre-charge capacitor to said second pre-charge voltage, and wherein said charge pump output control circuit is coupled to said second low noise reference and is adjusting said second reference voltage output to thereby control said final level of said discharging current.

20. The integrated circuit as set forth in claim 19 further comprising:

an N-channel mirror transistor matched to said N-channel output transistor and having a gate coupled to said gate of said N-channel output transistor such that said N-channel mirror transistor and said N-channel output transistor have identical gate to-source voltages and a mirror current of said N-channel mirror transistor mirrors said discharging current in said N-channel output transistor by a factor M; and a discharging current monitor for monitoring said mirror current of said N-channel mirror transistor.

21. A method of operating a charge pump comprising a P-channel output transistor for injecting a charging current onto a loop filter coupled to an output of the charge pump when a Pump Up control signal received by the charge pump is enabled, the method comprising the steps of:

storing on a first pre-charge capacitor a first pre-charge voltage at least equal to a first desired gate-to-source voltage of the P-channel output transistor; and coupling the first pre-charge capacitor to a gate of the P-channel output transistor via a switch when the Pump Up signal is enabled, such that the first pre-charge voltage turns on the P-channel output transistor and the charging current is adjusted to a final level determined by the first desired gate-to-source voltage.

22. The method as set forth in claim 21 further comprising the step of discharging the first desired gate-to-source voltage of the P-channel output transistor when the Pump Up control signal is disabled.

23. The method as set forth in claim 22 wherein the step of discharging the first desired gate-to-source voltage comprises the sub-step of coupling the gate of the P-channel output transistor to a VDD power supply rail.

\* \* \* \* \*